US010680092B2

(12) United States Patent
Moens et al.

(10) Patent No.: US 10,680,092 B2
(45) Date of Patent: Jun. 9, 2020

(54) ELECTRONIC DEVICE INCLUDING A TRANSISTOR WITH A NON-UNIFORM 2DEG

(71) Applicant: SEMICONDUCTOR COMPONENTS INDUSTRIES, LLC, Phoenix, AZ (US)

(72) Inventors: Peter Moens, Erwetegem (BE); Aurore Constant, Oudenaarde (BE); Peter Coppens, Kanegem (BE); Abhishek Banerjee, Kruibeke (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/148,127

(22) Filed: Oct. 1, 2018

(65) Prior Publication Data

US 2020/0105916 A1    Apr. 2, 2020

(51) Int. Cl.
| | |
|---|---|
| *H01L 29/778* | (2006.01) |
| *H01L 29/417* | (2006.01) |
| *H01L 29/20* | (2006.01) |
| *H01L 29/205* | (2006.01) |
| *H01L 21/02* | (2006.01) |

(Continued)

(52) U.S. Cl.
CPC ...... *H01L 29/7785* (2013.01); *H01L 21/0254* (2013.01); *H01L 21/0262* (2013.01); *H01L 29/1029* (2013.01); *H01L 29/2003* (2013.01); *H01L 29/205* (2013.01); *H01L 29/41775* (2013.01); *H01L 29/66462* (2013.01); *H01L 21/30612* (2013.01)

(58) Field of Classification Search
CPC ................ H01L 29/7785; H01L 29/7789
See application file for complete search history.

(56) References Cited

U.S. PATENT DOCUMENTS

| | | |
|---|---|---|
| 2002/0167023 A1 | 11/2002 | Chavarkar et al. |
| 2003/0020092 A1 | 1/2003 | Parikh et al. |
| (Continued) | | |

OTHER PUBLICATIONS

Okita et al.; "Through Recessed and Regrowth Gate Technology for Realizing Process Stability of GaN-GITs"; Proceedings of the 2016 28th International Symposium on Power Semiconductor Devices and ICs; IEEE (publisher); 2016; pp. 23-26.

(Continued)

*Primary Examiner* — Daniel Whalen
(74) *Attorney, Agent, or Firm* — Abel Schillinger, LLP (57) ABSTRACT

An electronic device can include a channel layer, a first carrier supply layer, a gate electrode of a HEMT, and a drain electrode of the HEMT. The HEMT can have a 2DEG along an interface between the channel and first carrier supply layers. In an aspect, the 2DEG can have a highest density that is the highest at a point between the drain and gate electrodes. In another aspect, the HEMT can further comprise first and second carrier supply layers, wherein the first carrier supply layer is disposed between the channel and second carrier supply layers. The second carrier supply layer be thicker at a location between the drain and gate electrodes. In a further aspect, a process of forming an electronic device can include the HEMT. In a particular embodiment, first and second carrier supply layers can be epitaxially grown from an underlying layer.

20 Claims, 6 Drawing Sheets

(51) Int. Cl.
  *H01L 29/10*   (2006.01)
  *H01L 29/66*   (2006.01)
  H01L 21/306   (2006.01)

(56) References Cited

U.S. PATENT DOCUMENTS

| | | |
|---|---|---|
| 2006/0220065 A1 | 10/2006 | Kawasaki et al. |
| 2007/0164315 A1 | 7/2007 | Smith et al. |
| 2009/0072272 A1* | 3/2009 | Suh .................... H01L 29/1066 |
| | | 257/194 |
| 2009/0146185 A1 | 6/2009 | Suh et al. |
| 2009/0267078 A1* | 10/2009 | Mishra ................ H01L 29/2003 |
| | | 257/76 |
| 2010/0258843 A1 | 10/2010 | Lidow et al. |
| 2013/0099285 A1 | 4/2013 | Hwang et al. |
| 2013/0126889 A1 | 5/2013 | Bahl |
| 2013/0313560 A1 | 11/2013 | Khalil et al. |
| 2014/0335666 A1 | 11/2014 | Koehler et al. |
| 2018/0374952 A1* | 12/2018 | Khalil ................ H01L 29/7787 |

OTHER PUBLICATIONS

Huang et al.; "Mechanism of PEALD-Grown AlN Passivation for AlGaN/GaN HEMTs: Compensation of Interface Traps by Polarization Charge"; IEEE Electron Device Letters; vol. 34, No. 2; 2013; pp. 193-195.

Huang et al.; "Effective Passivation of AlGaN/GaN HEMTs by ALD-Grow AlN Thin Film"; IEEE Electron Device Letters; vol. 33, No. 4; 2012; pp. 516-518.

* cited by examiner

FIG. 12

ELECTRONIC DEVICE INCLUDING A TRANSISTOR WITH A NON-UNIFORM 2DEG

FIELD OF THE DISCLOSURE

The present disclosure relates to electronic devices, and more particularly to, electronic devices including transistors with non-uniform two dimension electron gas.

RELATED ART

High electron mobility transistors can allow very high current to flow between their drains and sources. The current can be in the form of electrons that flow from a source electrode to a drain electrode via a two dimension electron gas. The density of the two dimension electron gas can be substantially uniform between the source and drain electrodes for a depletion-mode transistor. An enhancement-mode transistor can be turned off when the gate-to-source voltage is 0 V and turned on when such voltage exceeds the threshold voltage. A dense two dimensional electron gas allows the on-state resistance to be low; however, a stronger electron gas comes at the expense of an increased drain-to-gate voltage and higher electrical field at the drain side of the gate electrode under off-state bias conditions. The increased voltage and electrical field can adversely affect the reliability of the transistor. Improved performance of enhancement-mode high electron mobility transistors is desired.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

A III-V material is intended to mean a material that includes at least one Group 13 and at least one Group 15 element. A III-N material is intended to mean a semiconductor material that includes at least one Group 13 element and nitrogen.

The term "semiconductor base material" refers to the principal material within a semiconductor substrate, region, or layer, and does not refer to any dopant within the semiconductor substrate, region, or layer. A boron-doped Si layer has Si as the semiconductor base material, and a C-doped GaN layer has GaN as the semiconductor base material.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) for the value are reasonable differences from the ideal goal of exactly as described.

Group numbers correspond to columns within the Periodic Table of Elements based on the IUPAC Periodic Table of Elements, version dated Nov. 28, 2016.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A high electron mobility transistor (HEMT) can have a structure with a two dimension electron gas (2DEG) that can allow for good on-state resistance (Rdson), a sufficiently high threshold voltage, and good reliability by controlling the shape of the electric field within semiconductor layers between gate and drain electrodes of the HEMT structure. The shaping of the electric field can be achieved with a carrier supply layer that has different thicknesses at different locations between the gate and drain electrodes. In an embodiment, the thickest part of the carrier supply layer can be at a location between the gate and drain electrodes. The shaping allows for a relatively lower voltage at the gate electrode due to reduced capacitive coupling between the drain and gate electrodes of the HEMT structure via the 2DEG. A lower electrical field at the edge of the gate electrode can be controlled by the shaping and by a foot portion of a dielectric layer adjacent to the gate electrode. Both can help improve the reliability of the HEMT. Many different embodiments can be used, and therefore, skilled artisans have flexibility in designing a HEMT structure to meet the needs or desires for a particular application.

In an aspect, an electronic device can include a channel layer, a first carrier supply layer overlying the channel layer, a gate electrode of a HEMT overlying the channel layer, and a drain electrode of the HEMT overlying the channel layer. The HEMT can have a 2DEG along an interface between the channel and first carrier supply layers. The 2DEG can have a first density adjacent to a first point, a second density adjacent to a second point, and a third density adjacent to a third point, wherein the gate electrode is closer to the first point than to the second and third points, the drain electrode is closer to the third point than to the first and second points, and the second point is disposed between the first and third points. The second density can be greater than each of the first and third densities.

In another aspect, an electronic device can include a channel layer, a first carrier supply layer overlying the channel layer, a gate electrode of a HEMT overlying the channel layer, drain electrode of the HEMT overlying the channel layer, and a second carrier supply layer. The second carrier supply layer can include a first film overlying the first carrier supply layer, and a second film overlying the first film, wherein the gate electrode is closer to the first film than the second film, and the second film is closer to the drain electrode than the gate electrode.

In a further aspect, a process of forming an electronic device can include forming a first carrier supply layer over a channel layer, forming a gate electrode of a HEMT over the channel layer, forming a second carrier supply layer over the first carrier supply layer, and forming a drain electrode of the HEMT overlying the channel layer. First, second, and third points can lie along an interface between the channel and first carrier supply layer. The gate electrode can be closer to the first point than to the second and third points, the drain electrode can be closer to the third point than to the first and second points, and the second point can be disposed between the first and third points. The second carrier supply layer can be thicker over the second point as compared to the first and third points.

Figure 1:
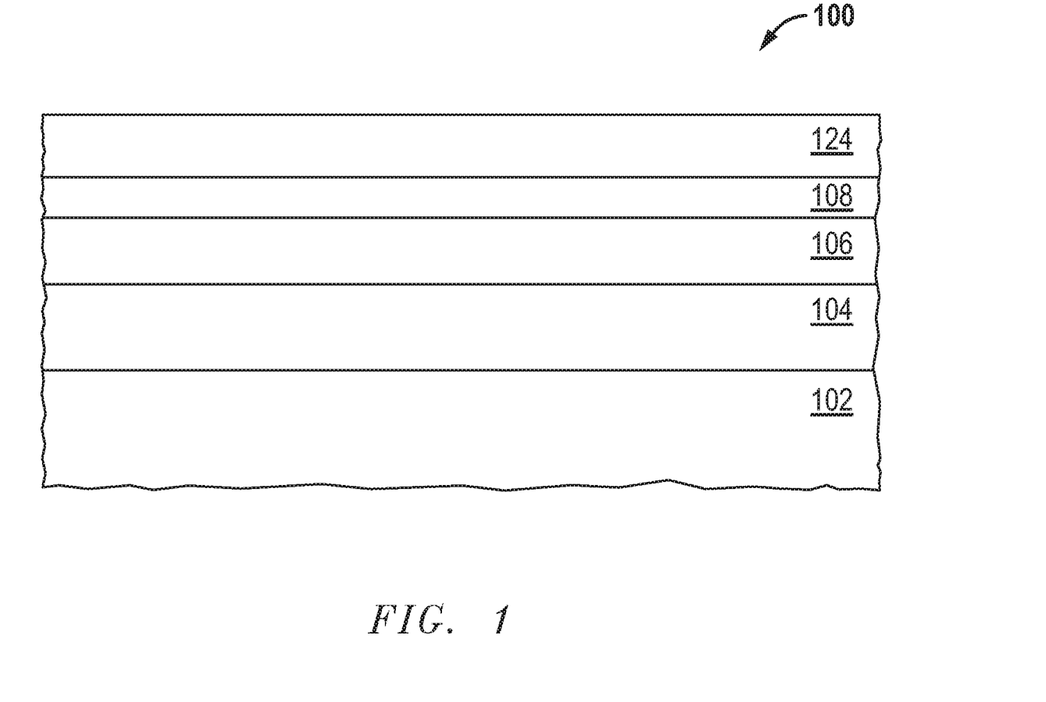
FIG. 1 includes an illustration of a cross-sectional view of a portion of a workpiece including a substrate, a buffer layer, a channel layer, a carrier supply layer, and a gate electrode layer.

FIG. 1 includes a cross-sectional view of a portion of a workpiece 100 that can include a substrate 102, a buffer layer 104, a channel layer 106, a carrier supply layer 108, and a gate electrode layer 124. The substrate 102 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface can be selected depending upon the composition of the overlying semiconductor layers.

The buffer layer 104 can include a III-N material, and in a particular embodiment, include $Al_aGa_{(1-a)}N$, where $0 \leq a \leq 1$. The composition of the buffer layer 104 may depend on the composition of the semiconductor base material of the channel layer 106 and the designed operating voltage of the HEMT. The composition of the buffer layer 104 can be changed as a function of thickness, such that the buffer layer 104 has a relatively greater aluminum content closer to the substrate 102 and relatively greater gallium content closer to the channel layer 106. In a particular embodiment, the cation (metal atoms) content in the semiconductor base material the buffer layer 104 near the substrate 102 can be 10 atomic % to 100 atomic % Al with the remainder Ga, and the cation content in the semiconductor base material the buffer layer 104 near the channel layer 106 can be 0 atomic % to 50 atomic % Al with the remainder Ga. In another embodiment, the buffer layer 104 can include a plurality of films. The buffer layer 104 can have a thickness in a range from approximately 1 micron to 6 microns.

The channel layer 106 can include $Al_zGa_{(1-z)}N$, where $0 \leq z \leq 0.1$ and have a thickness in a range from approximately 10 nm to 4000 nm. In a particular embodiment, the channel layer 106 is a GaN layer (z=0). The channel layer 106 may be unintentionally doped or doped with an electron donor (n-type) dopant or an electron acceptor (p-type) dopant. A high density two dimensional electron gas (2DEG) can be formed near portions of the interface of the channel layer 106 and the carrier supply layer 108 and is responsible for high mobility and lower resistivity of the transistor structure when in the on-state. In an enhancement-mode HEMT, a 2DEG may not be present under the gate structure when the HEMT is in an off-state. Any reduction of the 2DEG electrons will increase the on-resistance of the transistor. In an embodiment, the concentration of acceptors (when the carriers are electrons) or donors (when the carriers are holes) may be kept as low as reasonably possible.

In a particular embodiment, acceptors can include carbon from a source gas (e.g., $Ga(CH_3)_3$) when metalorganic chemical vapor deposition (MOCVD) is used to form the channel layer 106. In a particular embodiment, the lowest trap concentration is desired but may be limited by growth or deposition conditions and purity of the precursors. Thus, some carbon can become incorporated as the channel layer 106 is grown, and, such carbon can result in unintentional doping. The carbon content may be controlled by controlling the deposition conditions, such as the deposition temperature and flow rates. In an embodiment, the channel layer 106 has a carrier impurity concentration that is greater than 0 and at most $1 \times 10^{17}$ atoms/$cm^3$. In a particular embodiment, the carrier impurity concentration is in a range from $1 \times 10^{15}$ atoms/$cm^3$ to $5 \times 10^{16}$.

In an embodiment, the channel layer 106 has a thickness that is at least 50 nm. When the thickness is less than 50 nm, a 2DEG may be more difficult to generate, maintain, or both. In another embodiment, the channel layer 106 has a thickness that is at most 5000 nm. In a particular embodiment, the thickness in a range from 50 nm to 300 nm can provide sufficiently thick channel layer 106 to allow for the proper generation and maintaining of the 2DEG and still obtain a reasonable value for Rdson. Although not illustrated, a spacer layer may be used between the channel and carrier supply layers 106 and 108 if desired.

The carrier supply layer 108 can include a III-V semiconductor base material, such as a III-N semiconductor base material. In a particular embodiment, the carrier supply layer 108 can include $Al_xIn_yGa_{(1-x-y)}N$, wherein $0<x\leq1$ and $0\leq y\leq0.5$. In a finished device, HEMT structure will have another carrier supply layer, and thus, in an embodiment, the carrier supply layer 108 may include $Al_xGa_{(1-x)}N$, wherein $0<x\leq0.5$. The carrier supply layer 108 can include a single film or a plurality of films. When the carrier supply layer 108 includes a plurality of films, the aluminum content can remain substantially the same or increase or decrease as distance from the channel layer 106 increases. As the aluminum content in the carrier supply layer 108 increases, the thickness of the carrier supply layer 108 may be relatively thinner. In an embodiment, the carrier supply layer 108 has a thickness of at least 5 nm, and in another embodiment, the carrier supply layer 108 has a thickness of at most 150 nm. In a particular embodiment, the carrier supply layer 108 has a thickness in a range from 20 nm to 90 nm.

The buffer layer 104, the channel layer 106, and carrier supply layer 108 can be formed using an epitaxial growth technique, and thus, the carrier supply layer 108, the channel layer 106, and at least a portion of the buffer layer 104 can be monocrystalline. In a particular embodiment, metal-containing films can be formed using metalorganic chemical vapor deposition.

The gate electrode layer 124 overlies the carrier supply layer 108. The gate electrode layer 124 can include a p-type semiconductor material. In an embodiment, the p-type semiconductor material can include p-type doped $Al_cGa_{(1-c)}N$ wherein $0\leq c\leq1$. The p-type dopant can include Mg, Zn, Cd, or the like. The p-type semiconductor material can be monocrystalline or polycrystalline. The gate electrode layer 124 can have a dopant concentration of at least $1\times10^{18}$ atoms/cm$^3$. In another embodiment, the dopant concentration is at most $1\times10^{21}$ atoms/cm$^3$. The gate electrode layer 124 can be formed using any of the techniques that can be used in forming the channel layer 106 or the carrier supply layer 108. The p-type dopant can be incorporated in-situ or introduced into the gate electrode layer after deposition. The gate electrode layer 124 can have a thickness in a range from 20 nm to 300 nm.

Figure 2:
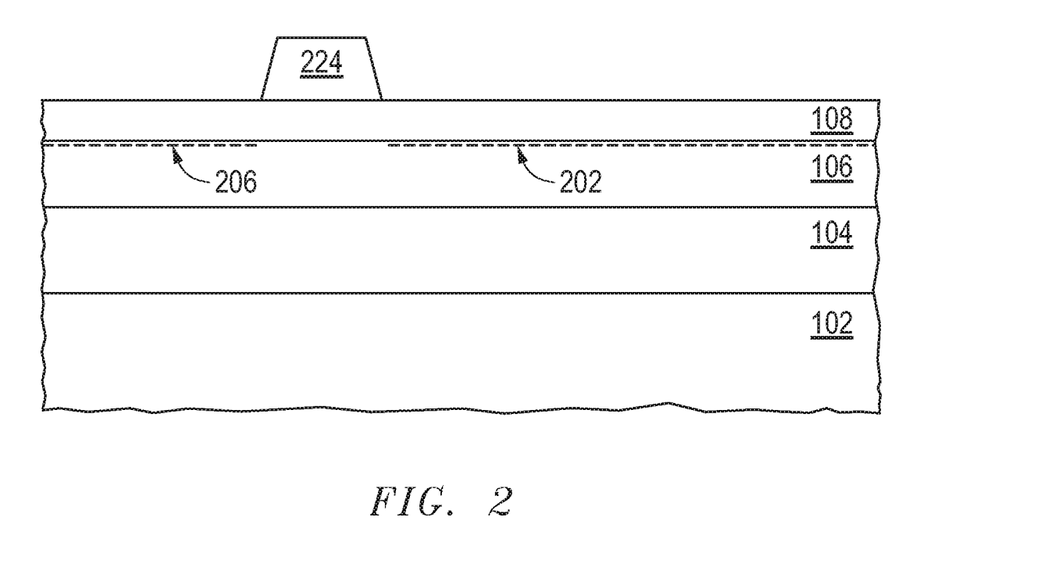
FIG. 2 includes an illustration of a cross-sectional view of the workpiece of FIG. 1 after patterning the gate electrode layer to form a gate electrode.

The gate electrode layer 124 can be patterned to achieve the shape of the gate electrode 224 in FIG. 2 for the enhancement-mode HEMT being formed. A portion of the gate electrode layer 124 lying outside the gate region can be removed using a technique that does not significantly etch the carrier supply layer 108. When the gate electrode layer includes p-type GaN, the gate electrode layer can be dry etched using a combination of a fluorine chemistry, such as $SF_6$, $CHF_3$, $NF_3$, or the like, and a chlorine chemistry, such as $BCl_3$, HCl, $Cl_2$, or the like. Aluminum-containing films or layers are not significantly etched using a fluorine chemistry, as $AlF_3$ forms and stops further etching of the aluminum-containing films or layers. After the gate electrode 224 is formed, the etch chemistry can be changed to slightly recess the carrier supply layer 108 by no more than approximately 5 nm. The etch chemistry can include the chlorine chemistry without the fluorine chemistry, or wet etched using a base, such as tetramethyl ammonium hydroxide (($CH_3)_4$)NOH or TMAH), KOH, NaOH, or the like. As illustrated in FIG. 2, a 2DEG 202 lies to the right of the gate electrode 224, and a 2DEG 206 lies to the left of the gate electrode 224. At this point in the process, the densities of the 2DEGs 202 and 206 are substantially uniform and the same.

Figure 3:
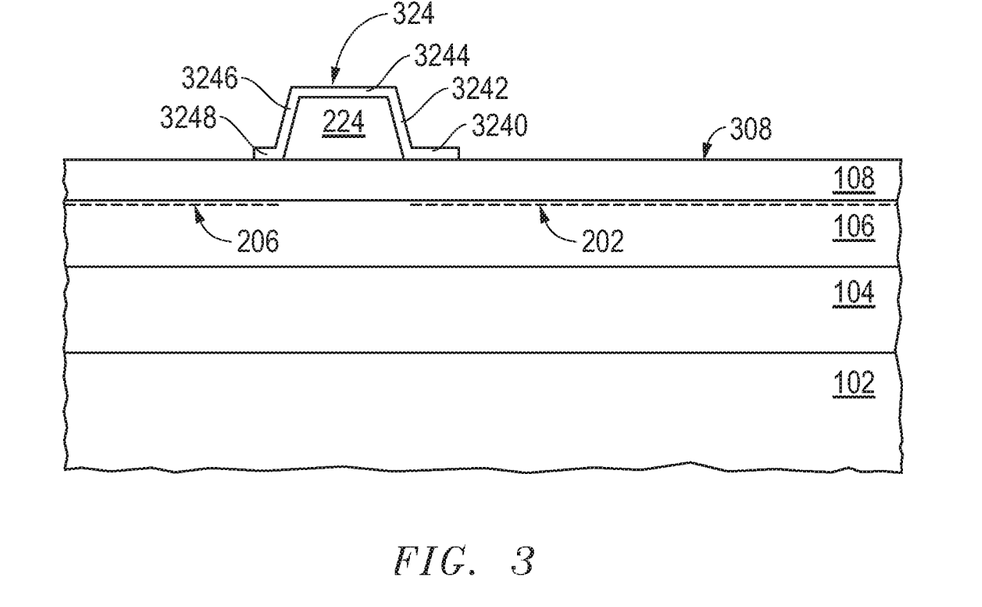
FIG. 3 includes an illustration of a cross-sectional view of the workpiece of FIG. 2 after forming a dielectric layer over the gate electrode and portions of the carrier supply layer.

In FIG. 3, a dielectric layer 324 is formed over the carrier supply layer 108 and gate electrode 224. The dielectric layer 324 can include a dielectric material that does not have any significant polarization charge. An exemplary material can include $Al_2O_3$, $ZrO_2$, $HfO_2$, $SiO_2$, $TiO_2$, $Ta_2O_5$, $Nb_2O_5$, another suitable metal oxide, or a corresponding oxynitride. The dielectric layer 324 can be deposited using atomic layer deposition (ALD) or a chemical vapor deposition, such as metalorganic chemical vapor deposition. In an embodiment, the dielectric layer 324 can have a thickness in a range from 1 nm to 100 nm.

The dielectric layer 324 can be patterned to leave portions over the top of the gate electrode 224 (top portion 3244), along sidewalls of the gate electrode (sidewall portions 3242 and 3246), and along the carrier supply layer 108 (foot portions 3240 and 3248). A subsequently-formed source electrode will be formed to the left of the gate electrode 224, and a subsequently-formed drain electrode will be formed to the right of the gate electrode 224. The foot portion 3240 has a length that extends in a direction substantially parallel to the surface 308 of the carrier supply layer 108 towards the subsequently-formed drain electrode. The foot portion 3248 has a length that extends in a direction substantially parallel to the surface 308 of the carrier supply layer 108 towards the subsequently-formed source electrode (the direction opposite the length of the foot portion 3240). The actual length used for the foot portion 3240 may depend on the electrical field when the HEMT is in the off-state toward the drain electrode, and the actual length used for the foot portion 3248 may depend on the electrical field when the HEMT is in the off-state toward the source electrode. The length of the foot portion 3240 may be in a range from 0.001 micron to 5 microns. The length of the foot portion 3240 can be longer than the length of the foot portion 3248 because, when the HEMT is in the off-state, the electrical field along the drain side of the gate electrode 224 is higher than the electrical field along the source side of the gate electrode 224. On a relative basis, the length of the foot portion 3248 may be at most 70%, at most 50%, or at most 30% of the length of the foot portion 3240. In a particular embodiment, the foot portion 3248 may be omitted.

Another carrier supply layer can be formed, and its shape may be tailored to achieve a desired 2DEG density profile. The other carrier supply layer can be formed as a set of discrete films that are spaced apart by different distances from the gate electrode 224. The gate electrode 224 will be closer to a lower film as compared to an upper film within such other carrier supply layer. As will be addressed below, the thickness of the films within the other carrier supply layer can be tailored to achieve desired 2DEG densities at particular points along the interface between the channel layer 106 and the carrier supply layer 108.

Figure 4:
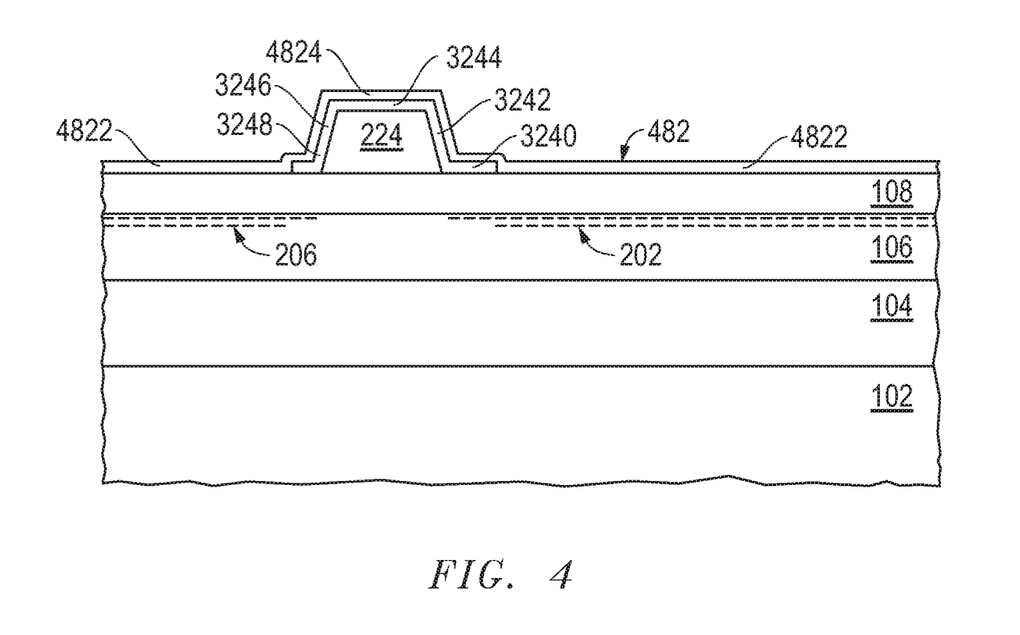
FIG. 4 includes an illustration of a cross-sectional view of the workpiece of FIG. 3 after a lower film of another carrier supply layer.

FIG. 4 illustrates the workpiece after forming a lower film 482 of another carrier supply layer over the carrier supply layer 108. Portions 4822 of the lower film 482 can be epitaxially grown from the carrier supply layer 108. Other portions 4824 of the lower film 482 overlie the dielectric layer 324 and can be amorphous. The portions 4822 of the lower film 482 have polarization charge that allows positive charge to be located along the interface between the carrier supply layer 108 and the portions 4822 of the lower film 482 and a higher 2DEG density under such portions. The portions 4824 of the lower film 482 do not significantly affect the 2DEG density interface between the channel and carrier supply layers 106 and 108 under the portion 4824. The lower film 482 can include AlN. GaN, InN, AlGaN, InP, GaP, GaAs, or the like. In an embodiment, the lower film 482 includes AlN and is formed using atomic layer deposition, and in a particular embodiment, plasma-enhanced atomic layer deposition. The lower film 482 has a thickness in a range from 1 nm to 20 nm. The thickness may depend on part on the number of films that make up the other carrier supply layer. As the number of films increases, the thicknesses of the individual films may be relatively thinner, as compared to an embodiment in which fewer films are formed. In a particular embodiment, the thickness of the lower film 482 is in a range from 2 nm to 10 nm. After reading this specification, skilled artisans will be able to determine a thickness for the lower film 482 that meets the needs or desires for a particular application.

Figure 5:
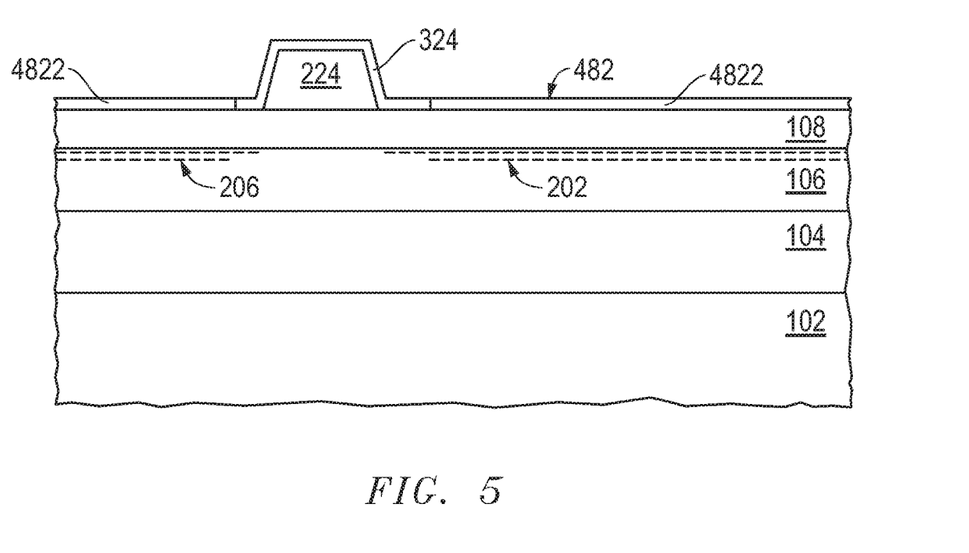
FIG. 5 includes an illustration of a cross-sectional view of the workpiece of FIG. 4 after removing portions of the lower film that overlie the dielectric layer.

An optional etch can be performed to remove the portion 4824 of the lower film 482 that overlies the gate electrode 224. The etch can use a chemistry that has an etch selectivity of amorphous AlN (portion 4824) to each of epitaxial AlN (portions 4822) and the material of the dielectric layer 324 that is much greater than 10:1. In an embodiment, the etch can be performed as a wet etch using a chlorine aqueous solution, such as RCA Standard Clean 2, or a basic aqueous solution that can include $(CH_3)_4NOH$, KOH, NaOH, $NH_4OH$, or the like. FIG. 5 includes an illustration after the portion 4824 is removed. If desired, the portion 4824 can remain, as the portion 4824 does not significantly add to the polarization charge and does not significantly increase leakage current between the drain and source of the HEMT.

Figure 6:
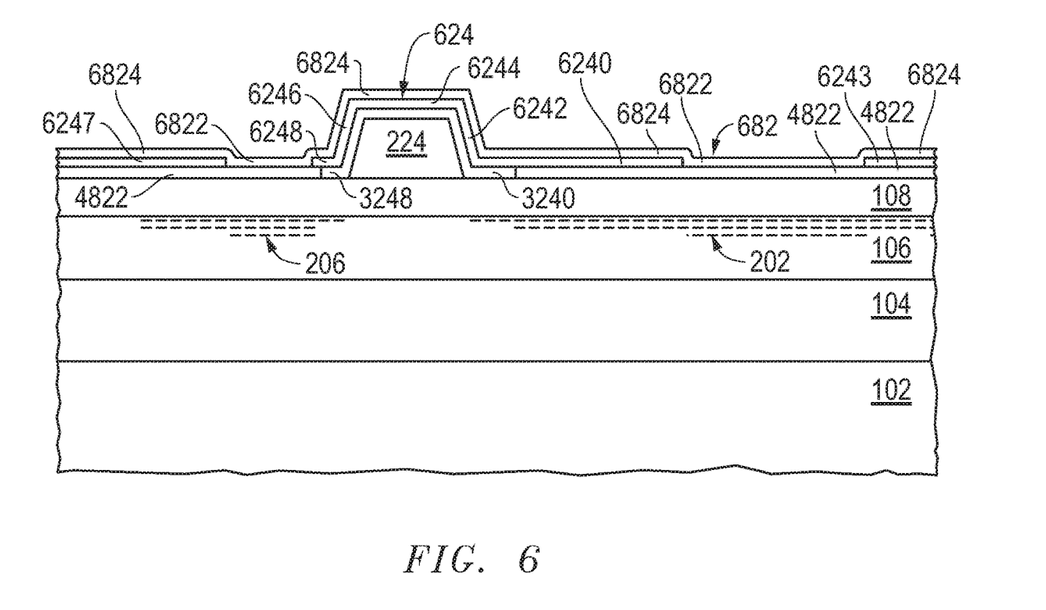
FIG. 6 includes an illustration of a cross-sectional view of the workpiece of FIG. 5 after forming another dielectric layer and an upper film of the other carrier supply layer.

Another dielectric layer 624 and an upper film 682 of the other carrier supply layer can be formed over the workpiece, as illustrated in FIG. 6. The dielectric layer 624 can include any of the materials and have any of the thicknesses as previously described with respect to the dielectric layer 324. In an embodiment, the dielectric layers 324 and 624 can have the same composition or different compositions, and in another embodiment the dielectric layers 324 and 624 can have the same thickness or different thicknesses. The upper film 682 can include any of the materials and have any of the thicknesses as previously described with respect to the lower film 482. In an embodiment, the films 482 and 682 can have the same composition or different compositions, and in another embodiment the films 482 and 682 can have the same thickness or different thicknesses. The upper film 682 includes portions 6822 that are epitaxially grown from exposed portions of the lower film 482 and portions 6824 that overlie the dielectric layer 624. As can be seen in the embodiment of FIG. 6, the non-uniform densities of the 2DEGs 202 and 206 are becoming more evident. The significance of the 2DEG densities will be discussed in more detail later in this specification.

After forming the dielectric layer 624 and before forming the upper film 682, the dielectric layer 624 is patterned to expose portions of the lower film 482 from which the portions 6822 are to be epitaxially grown. In particular, the dielectric layer 624 can be patterned to leave portions over the top of the gate electrode 224 (top portion 6244), along sidewalls of the gate electrode (sidewall portions 6242 and 6246), and along the lower film 482 (foot portions 6240 and 6248).

The foot portion 6240 has a length that extends in a direction substantially parallel to the length of the foot portion 3240 of the dielectric layer 324. The foot portion 6248 has a length that extends in a direction substantially parallel to the length of the portion 3248 of the dielectric layer 324. The actual length used for the foot portion 6240 may depend on the electrical field when the HEMT is in the off-state toward the drain electrode, and the actual length used for the foot portion 6248 may depend on the electrical field when the HEMT is in the off-state toward the source electrode. The length of the foot portion 6240 is longer than the length of the foot portion 3240 of the dielectric layer 324 (extends farther from the gate electrode 224) and may be in a range from 0.1 micron to 15 microns. The length of the foot portion 6248 is longer than the length of the foot portion 3248 of the dielectric layer 324 (extends farther from the gate electrode 224) and may be in a range from 0.1 micron to 1 micron. In a particular embodiment, the foot portion 6248 may be omitted. In the embodiment as illustrated in FIG. 6, the dielectric layer 624 includes portions 6243 and 6247 that cover locations where subsequently-formed drain and source electrodes will be formed. If needed or desired for a particular application, portions 6243 and 6247 may not be formed. In another embodiment, the dielectric layer 324 can be formed with portions similar to portions 6243 and 6247 may be formed before forming the lower film 422.

The upper film 682 includes portions 6822 that are epitaxially grown from exposed portions of the lower film 482 and portions 6824 that overlie the dielectric layer 624, as illustrated in FIG. 6. As can be seen in the embodiment of FIG. 6, the different densities of the 2DEGs 202 and 206 are becoming more evident. The positive charge along the interface between the layer 108 and the lower film 482 increases as the combined thickness of the epitaxially grown portions 4822 and 6822 of the films 482 and 682, increases. The 2DEG density increases as the combined thickness of the epitaxially grown portions 4822 and 6822 of the films 482 and 682, increases. The significance of the 2DEG densities will be discussed in more detail later in this specification.

Figure 7:
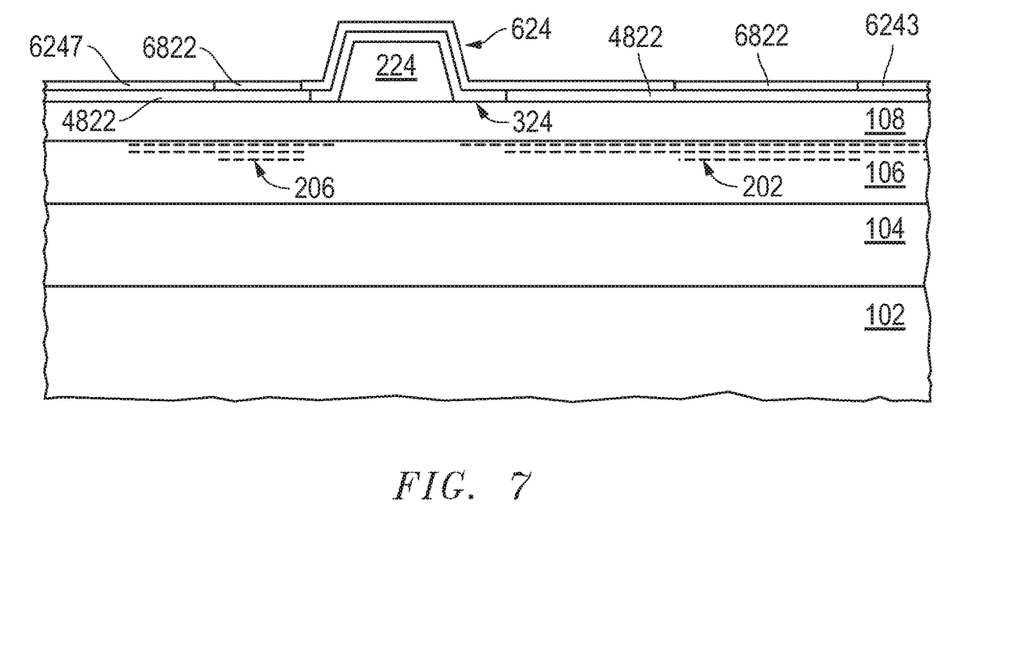
FIG. 7 includes an illustration of a cross-sectional view of the workpiece of FIG. 6 after removing portions of the upper film that overlie the other dielectric layer.

Similar to the portion 4824 of the lower film 482, an optional etch can be performed to remove the portions 6824 of the upper film 682 that overlie the dielectric layer 624, as illustrated in FIG. 7. The portions 6824 can be removed using any of the techniques previously described with respect to the portion 4824. The removal techniques for the portions 4824 and 6824 may be the same or different. In FIG. 7, the other carrier supply layer includes portions 4822 and 6822 of the films 482 and 682. If desired, the portions 6824 can remain, as the portion 6824 does not significantly add to the polarization charge and does not significantly increase leakage current between the drain and source of the HEMT. If needed or desired, further pairs of dielectric layers and polarizing films of the other carrier supply layer can be formed.

Figure 8:
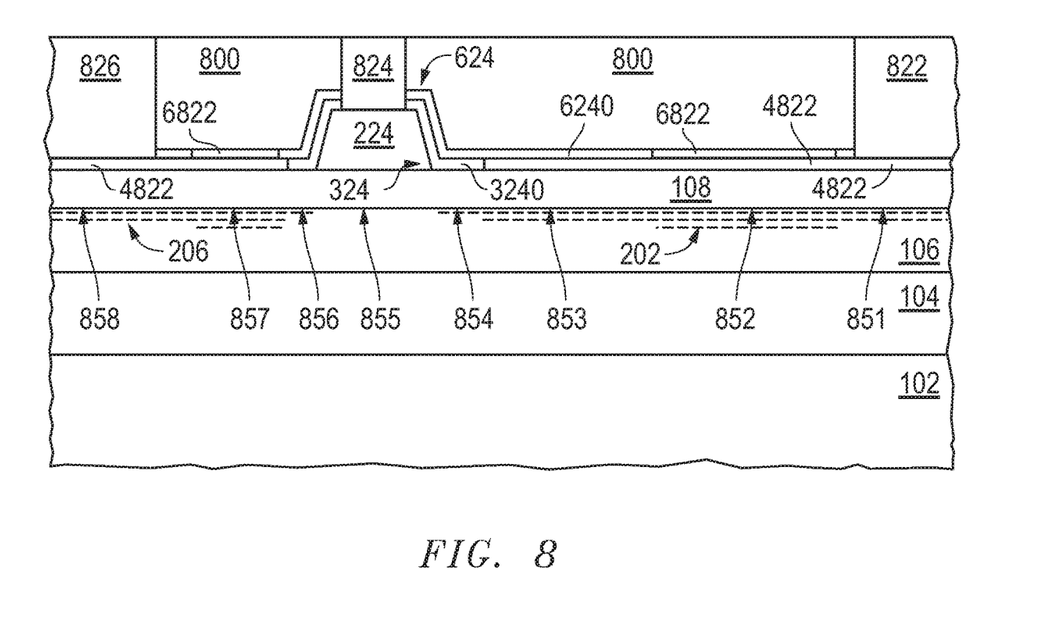
FIG. 8 includes an illustration of a cross-sectional view of a substantially completed high electron mobility transistor in accordance with an embodiment.

FIG. 8 illustrates the workpiece after forming an interlevel dielectric (ILD) layer 800, source and drain electrodes 822 and 826 and a gate interconnect 824. The ILD layer 800 can be formed over the dielectric layer 824. The ILD layer 800 can include a single film or a plurality of films. The single film or each of the films can include an oxide, a nitride, or an oxynitride. The ILD layer 800 can have a thickness in a range from 20 nm to 2000 nm.

A contact opening for the gate interconnect 824 can extend through the ILD layer 800 and the dielectric layers 324 and 624 and land on the gate electrode 224. More options are available for the contact openings for the source and drain electrodes 822 and 826. As the thickness of the other carrier supply layer, including portions 4822 and 6822 of the films 482 and 682, increases, the sheet resistance along the interface between the layers 106 and 108 decreases; however, the contact resistances between the source and drain electrodes 822 and 826 and their corresponding underlying films increase. As illustrated in FIG. 8, the contact openings for the drain and source electrodes 822 and 826 extend through the ILD layer 800 to lower film 482 and not the upper film 682 of the other carrier supply layer. In another embodiment (not illustrated), the upper film 682 may contact the drain and source electrodes 822 and 826. Regardless whether the upper film 682 is present at locations where contact openings are formed, the contact openings may land on the lower film 482, extend through at least portion, but not all of the thickness of the lower film 482, extend through all of the thickness of the lower film 482, or extend through at least a portion of the thickness of the carrier supply layer 108, or completely extend through the carrier supply layer 108. After reading this specification, skilled artisans will be able to determine depths of the contact openings for the drain and source electrodes 822 and 826 to achieve a desired combination of sheet resistance under the drain and source electrodes 822 and 826 and contact resistance between the drain and source electrodes 822 and 826 and the underlying films.

A conductive layer is formed over the ILD layer 800 and within the contact openings. The conductive layer can include a single film or a plurality of films. In an embodiment, the conductive layer can include an adhesion film and a barrier film. Such films may include Ta, TaSi, Ti, TiW, TiSi, TiN, or the like. The conductive layer can further include a conductive bulk film. The bulk film can include Al, Cu, or another material that is more conductive than other films within the conductive layer. In an embodiment, the bulk film can include at least 90 wt. % Al or Cu. The bulk film can have a thickness that is at least as thick as the other films within the conductive layer. In an embodiment, the bulk film has a thickness in a range from 20 nm to 900 nm and, in a more particular embodiment, in a range from 50 nm to 500 nm. More or fewer films can be used in the conductive layer. The number and composition of the films within the conductive layer can depend on the needs or desires for a particular application. After reading this specification, skilled artisans will be able to determine the composition of the conductive layer that is tailored to their devices.

The conductive layer is patterned to form the source electrode 822, the gate interconnect 824, and the drain electrode 826. In another embodiment, the gate interconnect 824 may be formed at a different interconnect level as compared to the source and drain electrodes 822 and 826 and have a different composition.

One or more additional interconnect levels and a passivation layer may be formed over the workpiece. Each interconnect level can include an ILD layer and interconnects. A conductive layer can be used at each interconnect level. The conductive layer may be the same or different from the other conductive layers described earlier in this specification. A substantially completed electronic device has been formed. One or more of the interconnect levels can include shield electrodes; however, by tailoring the 2DEG density along the interface of the layers 106 and 108, the need for shield electrodes can be reduced.

The densities of the 2DEGs 202 and 206 and positive charge densities can be tailored to achieved desired profiles. The relative local densities of the 2DEGs 202 and 206 are illustrated by the number of rows of "-" signs. On a relative basis, a higher number of rows of "-" signs corresponds to a relatively higher density, and a lower number or no rows of "-" signs corresponds to a relatively lower density. Skilled artisans will appreciate that the 2DEG is along the interface between the layers 106 and 108. Thus, the number of rows of "-" represent relative densities of within the 2DEGs 202 and 206 and do not represent how deep the 2DEG extends into the channel layer 106.

Points as noted in FIG. 8 are addressed to aid in understanding how the other carrier supply layer, including portions 4822 and 6822 of the films 482 and 682, affect positive charge density along the interface between the carrier supply layer 108 and the other carrier supply layer and 2DEG density at the interface between the channel layer 106 and the carrier supply layer 108. Points 851 and 858 underlie the drain and source electrodes 822 and 826. Portions of the lower film 482 are disposed between the carrier supply layer 108 and each of the drain and source electrodes 822 and 826. The presence of the other carrier supply layer helps to increase the 2DEG under the drain and source electrodes 822 and 826, as compared to none of the other carrier supply layer present between the carrier supply layer 108 and the drain and source electrodes 822 and 826. The higher 2DEG density results in lower sheet resistance along the interface between the layers 106 and 108 and is illustrated by two rows of "-" signs. If the other carrier supply layer is not present under the drain and source electrodes 822 and 826, then, the 2DEG density is lower and would be illustrated by a single row of "-" signs.

Points 852 and 857 underlie locations between the gate electrode 224 and each of the drain and source electrodes 822 and 826. Portions of the films 482 and 682 are disposed over the carrier supply layer 108 over points 852 and 857. In the embodiment as illustrated, the 2DEG densities corresponding to points 852 and 857 are the highest in the HEMT structure illustrated. The presence of both films 482 and 682 allows the sheet resistance within the HEMT to be lower than at points where only the film 482 is present or none of the other carrier supply layer is present. Thus, regions that include 852 and 857 help to keep Rdson low.

Point 853 underlies a location where the lower film 482, and not the upper film 682, is present, and points 854 and 856 underlie locations where the other carrier supply layer is not present. The density of the 2DEG and sheet resistance corresponding to point 853 is between the density of the 2DEG and sheet resistance at points 852 and 854. Thus, the region corresponding to point 853 allows the drain voltage to be decreased closer to the gate electrode 224. At points 854 and 856, the density of 2DEGs 202 and 206 would be same as if none of the other carrier supply layer be present and is illustrated by a single row of "-" signs. The regions corresponding to points 854 and 856 allow the drain voltage to be decreased further as compared to the point 853 and can help keep the electrical field under the foot portions 3240 and 3248 of the dielectric layer 324 lower than it would be if any part of the lower film 482 would be present. The lower electric field closer to the gate electrode 224 helps to improve reliability. Point 855 is under the gate electrode 224. The HEMT is an enhancement-mode transistor, and the density of the 2DEG at point 855 is insignificant compared to the other points and provides a sufficiently high threshold voltage for the HEMT.

With respect to the drain side of the HEMT (between the drain and gate electrodes 822 and 224), the shaping of the other carrier supply layer and the resultant density profile of the 2DEG 202 allows the electrical field to be tailored to a particular application. The part of the 2DEG with lowest density area (at point 854) will deplete the fastest in off-state, followed by the second lowest density area (at point 853) and then highest density area (at point 852). When the HEMT structure is in an off-state, a drain-to-gate voltage (Vdg) can be 200 V or higher, such as over 1000 V, depending on the desired operating voltage of the HEMT. For example, at 200 V, fewer films may be present within the other carrier supply layer, and at 1000 V, more films may be present within the other carrier supply layer with each successive (overlying) film having a length extending not as far toward the gate electrode 224 as compared to a prior (underlying) film.

With respect to the source side of the HEMT structure (between the source and gate electrodes 826 and 224), the shaping of the other carrier supply layer and the resultant density profile of the 2DEG 206 allows the electrical field to be tailored to a particular application. When the HEMT structure is in an off-state, the gate-to-source voltage (Vgs) may be at most 20 V, and thus, the shaping of the other carrier supply layer and the resultant density profile of the 2DEG 206 may not be as important as the density profile for the 2DEG 202. In another embodiment, only one of the films 482 and 682 or none of the other carrier supply layer may be present along the source side of the HEMT structure.

Different embodiments can be used without deviating from the concepts described herein. The concepts are well suited for an enhancement mode HEMT structure, whether such structure is configured for use as a transistor or a diode. The gate electrode 224 that can include a p-type GaN material can be replaced by a combination of a gate dielectric layer and a different gate electrode. The gate dielectric layer can include any of the materials as previously described with respect to the dielectric layer 324. The gate interconnect 824 may be the gate electrode in this embodiment. If needed or desired a material of the gate electrode in contact with the gate dielectric layer may be selected for a desired work function to achieve desired threshold voltage for the HEMT structure.

Figure 9:
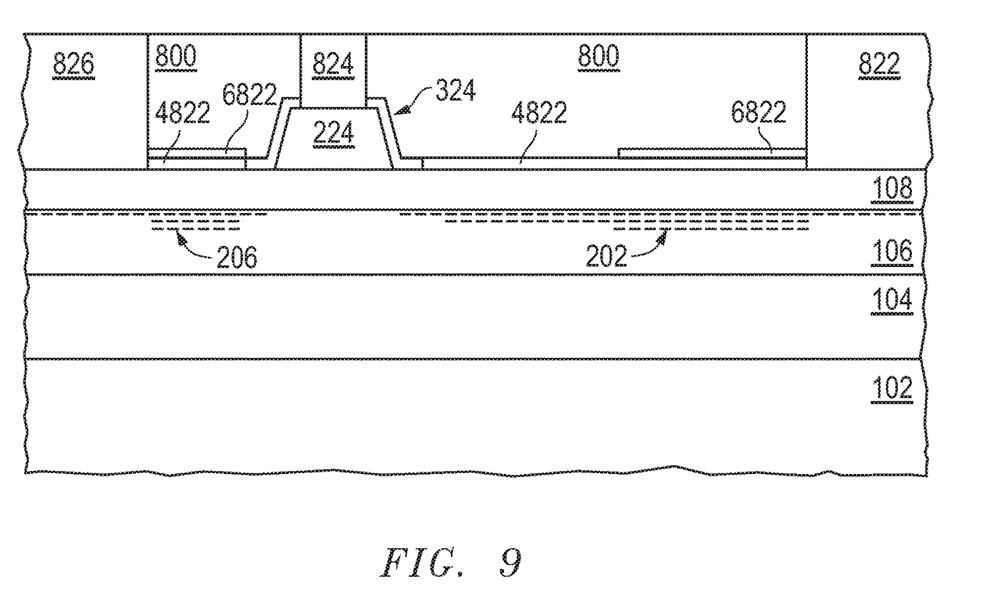
FIG. 9 includes an illustration of a cross-sectional view of a substantially completed high electron mobility transistor in accordance with another embodiment.

FIG. 9 includes another embodiment that is similar to the embodiment as illustrated in FIG. 8. The drain and source electrodes 822 and 826 extend through the other carrier supply layer and contacts the carrier supply layer 108. The 2DEG is lower and sheet resistance is higher under the drain and source electrodes 822 and 826; however, contact resistances for the drain and source electrodes 822 and 826 are lower because the carrier supply layer 108 may have a lower barrier height. The dielectric layer 624 is not illustrated and may or may not be present.

Figure 10:
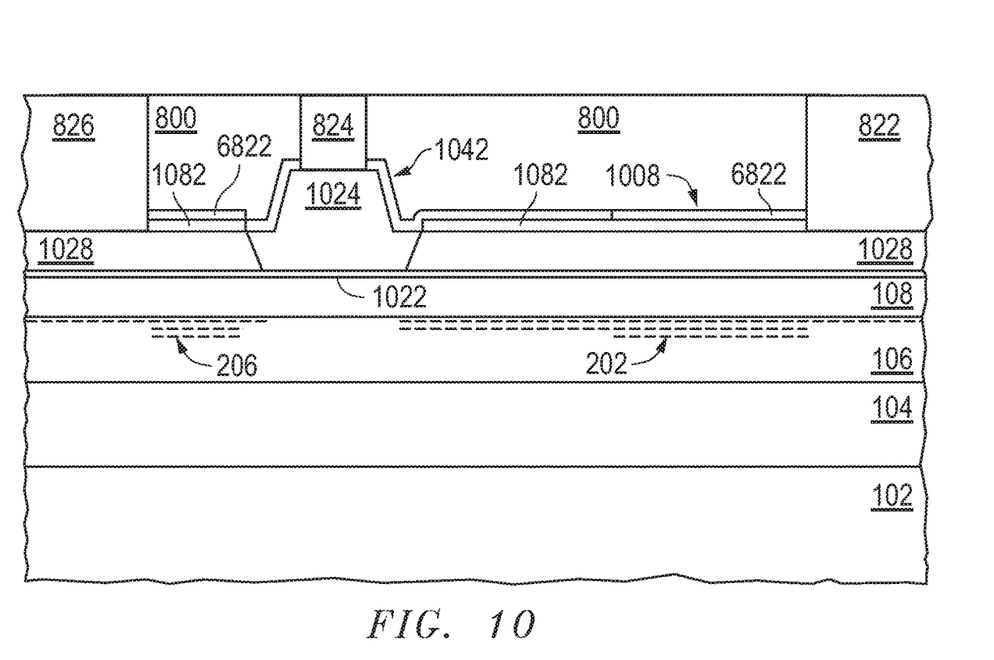
FIG. 10 includes an illustration of a cross-sectional view of a substantially completed high electron mobility transistor in accordance with yet another embodiment.

FIG. 10 includes a gate electrode 1024 that extends into a carrier supply layer 1028. After forming the carrier supply layer 108, an etch-stop layer 1022, the carrier supply layer 1028, and a lower film 1082 of a carrier supply layer 1008 can be formed. The composition of the etch-stop layer 1022 has a material different from the carrier supply layer 1028. In an embodiment, the etch-stop layer 1022 can include $In_hAl_{(1-h)}N$ where $0 \leq h \leq 1$. The thickness of the etch-stop layer 1022 can be relatively thin as compared to the carrier supply layers 108 and 1028. The carrier supply layer 1028 can include any of the materials and have any of the thicknesses as previously described with respect to the carrier supply layer 108. In an embodiment, the carrier supply layers 108 and 1028 can have the same composition or different compositions, and in another embodiment the carrier supply layers 108 and 1028 can have the same thickness or different thicknesses.

The lower film 1082 of the carrier supply layer 1008 can include any of the materials and have any of the thicknesses as previously described with respect to the lower film 482. In an embodiment, each of the etch-stop layer 1022, the carrier supply layer 1028, and the lower film 1082 can be epitaxially grown from their corresponding underlying films or layers. In a particular embodiment, the etch-stop layer 1022, the carrier supply layer 1028, and the lower film 1082 can be formed using metalorganic chemical vapor deposition (MOCVD). The lower film 1082 and the carrier supply layer 1028 can be patterned. The etch-stop layer 1022 can help with reducing the likelihood that the etch would reach the carrier supply layer 108.

A gate electrode 1024 can be formed within the opening and include a p-type GaN layer. A dielectric layer 1042 can be formed in a manner as previously described with respect to the dielectric layer 624. Similar to the dielectric layer 624, the dielectric layer 1042 covers part of the lower film 1082 to prevent further epitaxial growth over a portion of the lower film 1082 that is closer to the gate electrode 1024. An upper film 6822 of the carrier supply layer 1008 can be epitaxially grown from exposed portions of the lower film 1082. Portions (not illustrated) of the upper film 1084 that may be formed over the dielectric layer 1042 can be removed as previously described with respect to portions 4824. Other features can be formed in accordance with previously described embodiments. In a further embodiment, the lower film 1082 can be formed using PEALD instead of MOCVD. The process sequence would be similar to the dielectric layers 324 and 624 and the other carrier supply layer.

Figure 11:
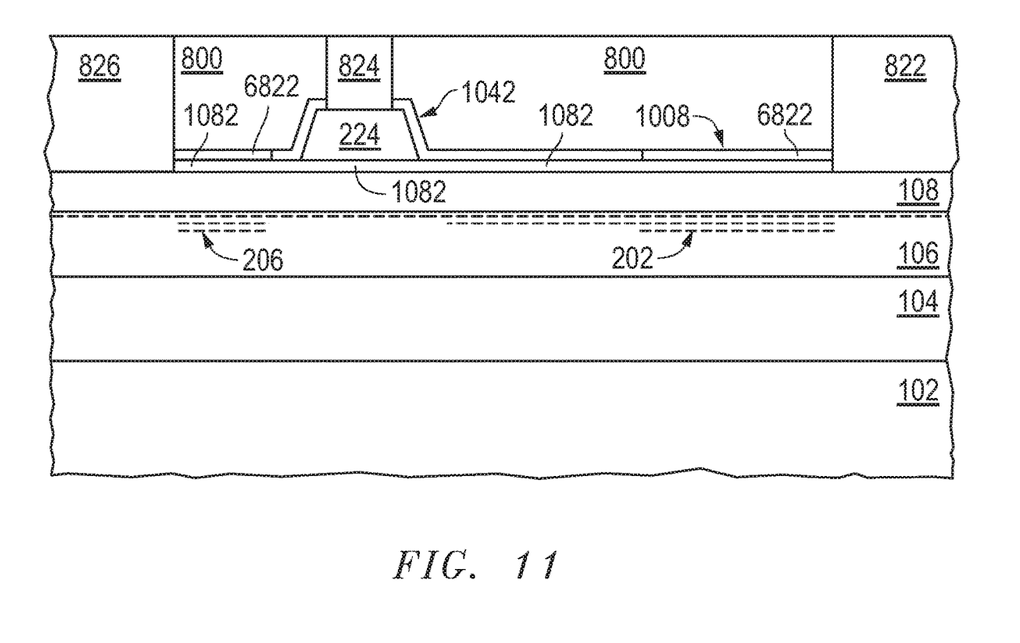
FIG. 11 includes an illustration of a cross-sectional view of a substantially completed high electron mobility transistor in accordance with still another embodiment.

FIG. 11 illustrates another embodiment that leverages features as previously described with respect to FIGS. 9 and 10. The process flow through the formation of the lower film 1082 of the carrier supply layer 1008 can be the same as described with respect to FIG. 10. The gate electrode 224 can be formed as illustrated and described in FIG. 9 can be formed over the lower film 1082. The subsequent processing can be similar to FIG. 10 starting with the formation of the dielectric layer 1042. Similar to the HEMT structure in FIG. 10, the process allows lower film 1082 to be formed as part of the epitaxial growth sequence using MOCVD.

Figure 12:
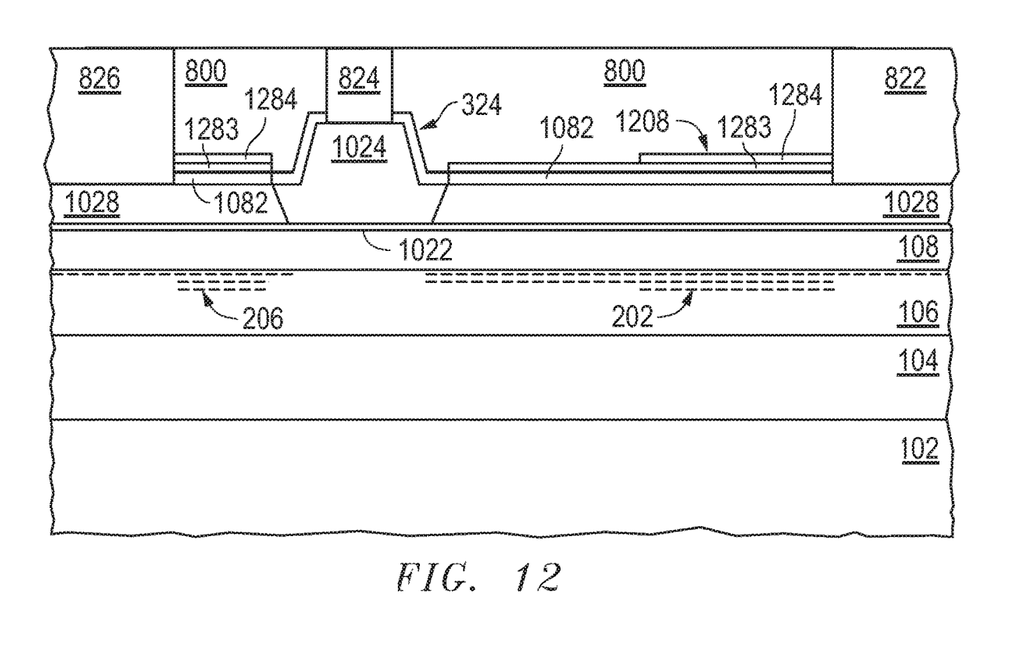
FIG. 12 includes an illustration of a cross-sectional view of a substantially completed high electron mobility transistor in accordance with a further embodiment.

FIG. 12 includes another embodiment in which an etch-stop film 1283 is used in patterning of the upper film 1284 for a carrier supply layer 1208. Before forming the gate electrode 1024, the etch-stop film 1283 can be epitaxially grown from the lower film 1082 of the carrier supply layer 1208. The etch-stop film 1283 can include GaN and be grown using MOCVD. Similar to the structure in FIG. 10, all layers, including the etch-stop film 1283 can be etched to form the opening for the gate electrode 1024. After forming the gate electrode, a dielectric layer 324 can be formed over the gate electrode 1024. The upper film 1284 of the carrier supply layer 1208 can be formed in a manner as previously described with respect to the upper film 684. The upper film 1284 will be substantially monocrystalline where it contacts the etch-stop film 1283. The upper film 1284 can include any of the materials and thicknesses as previously described with respect to the upper film 684. The upper film 1284 can be patterned to achieve the shape as illustrated in FIG. 12. In an embodiment, the etch-stop film 1283 can include GaN, and the upper film 1284 includes AlN. The etch chemistry used can etch AlN at a higher rate as compared to GaN. The remaining process sequence would be similar to a process sequence for the HEMT structure in FIG. 10.

Other embodiments can be used that include portions of the HEMT structures as previously illustrated and described. After reading this specification, skilled artisans can mix and match features for the prior embodiment to achieve the other embodiments. The particular structure selected can be tailored for a particular application.

Embodiments as described herein allow for a 2DEG density profile within a HEMT structure that can allow for good Rdson, a sufficiently high threshold voltage, and good reliability by controlling the shape of the electric field from a gate electrode to a drain electrode of the HEMT structure. The shaping of the electric field can be achieved by having a carrier supply layer with a material having a polarization charge that has different thicknesses at different locations between the gate and drain electrodes. In an embodiment, the thickest part of the carrier supply layer can be at a location between the gate and drain electrodes. The shaping allows for a relatively lower voltage and electrical field near the gate electrode due to the density profile of the 2DEG. The shaping of the 2DEG can help improve the reliability of the HEMT. Many different embodiments can be used, and therefore, skilled artisans have flexibility in designing a HEMT structure to meet the needs or desires for a particular application.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1

An electronic device can include:
a channel layer;
a first carrier supply layer overlying the channel layer;
a gate electrode of a high electron mobility transistor overlying the channel layer; and
a drain electrode of the high electron mobility transistor overlying the channel layer, wherein:
  the high electron mobility transistor has a two dimension electron gas along an interface between the channel and first carrier supply layers,
  the two dimension electron gas has a first density adjacent to a first point, a second density adjacent to a second point, and a third density adjacent to a third point,
  the gate electrode is closer to the first point than to the second and third points,
  the drain electrode is closer to the third point than to the first and second points,
  the second point is disposed between the first and third points, and
  the second density is greater than each of the first and third densities.

Embodiment 2

The electronic device of Embodiment 1, wherein the drain electrode overlies the third point.

Embodiment 3

The electronic device of Embodiment 1, wherein the gate electrode does not overlie the first point.

Embodiment 4

The electronic device of Embodiment 3, wherein a fourth point underlies the gate electrode, and the two dimension electron gas does not include the fourth point, or the two dimension electron gas is lower than each of the first, second, and third densities.

Embodiment 5

The electronic device of Embodiment 1, further includes a second carrier supply layer that is thicker over the second point, as compared to the first point.

Embodiment 6

The electronic device of Embodiment 1, further includes a dielectric layer over the gate electrode, wherein the dielectric layer includes a first portion having a length that extends in a direction toward the drain electrode.

Embodiment 7

An electronic device can include:
a channel layer;
a first carrier supply layer overlying the channel layer;
a gate electrode of a high electron mobility transistor overlying the channel layer;
a drain electrode of the high electron mobility transistor overlying the channel layer; and
a second carrier supply layer including:
  a first film overlying the first carrier supply layer; and
  a second film overlying the first film, wherein the gate electrode is closer to the first film than the second film, and the second film is closer to the drain electrode than the gate electrode.

Embodiment 8

The electronic device of Embodiment 7, wherein the drain electrode overlies the first film and not the second film of the second carrier supply layer.

Embodiment 9

The electronic device of Embodiment 7, wherein the second carrier supply layer is substantially monocrystalline.

Embodiment 10

The electronic device of Embodiment 7, wherein the second carrier supply layer is an AlN layer.

Embodiment 11

The electronic device of Embodiment 7, further includes a dielectric layer over the gate electrode, wherein the dielectric layer includes a first portion having a first length that extends in a first direction toward the drain electrode.

Embodiment 12

The electronic device of Embodiment 11, wherein the dielectric layer includes a second portion that lies along a sidewall of the gate electrode, is contiguous with the first portion, and is farther from the drain electrode as compared to the first portion.

Embodiment 13

The electronic device of Embodiment 11, further includes a source electrode of the high electron mobility transistor, wherein the dielectric layer:
  includes a second portion having a second length that extends in a second direction toward the source electrode and opposite the first direction, wherein the second length is shorter than the first length; or
  does not include a portion having a length extending from the gate electrode toward the source electrode along the second direction.

Embodiment 14

The electronic device of Embodiment 7, further includes an etch-stop layer overlying the first carrier supply layer, wherein the gate electrode overlies the etch-stop layer.

Embodiment 15

The electronic device of Embodiment 14, further includes a third carrier supply layer disposed between the first and second charge supply layers.

Embodiment 16

The electronic device of Embodiment 7, further includes an etch-stop layer, wherein the etch-stop layer is disposed between the first and second charge supply layers.

Embodiment 17

The electronic device of Embodiment 7, further includes a source electrode of the high electron mobility transistor overlying the channel layer; and a dielectric layer over the gate electrode, wherein:
  the second carrier supply layer is a substantially monocrystalline AlN layer,
  the drain electrode does not overlie the second film of the second carrier supply layer,
  the dielectric layer includes an oxide and:
    has a first portion having a first length that extends in a first direction toward the drain electrode, and
    has a second portion having a second length that extends in a second direction toward the source electrode, wherein the second direction is opposite the first direction, and the second length is shorter than the first length.

Embodiment 18

A process of forming an electronic device can include forming a first carrier supply layer over a channel layer; forming a gate electrode of a high electron mobility transistor over the channel layer; forming a second carrier supply layer over the first carrier supply layer; and forming a drain electrode of the high electron mobility transistor overlying the channel layer, wherein:
  first, second, and third points lie along an interface between the channel and first carrier supply layer,
  the gate electrode is closer to the first point than to the second and third points,
  the drain electrode is closer to the third point than to the first and second points,
  the second point is disposed between the first and third points, and
  the second carrier supply layer is thicker over the second point as compared to the first and third points.

Embodiment 19

The process of Embodiment 18, wherein forming the second charge supply layer includes forming at least a portion of the second carrier supply layer using plasma enhanced atomic layer deposition.

Embodiment 20

The process of Embodiment 19, further includes forming a dielectric layer over the gate electrode, wherein the dielectric layer includes a portion, wherein the portion extends towards the drain electrode.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:
1. An electronic device comprising:
  a channel layer;
  a first carrier supply layer overlying the channel layer;
  a gate electrode of a high electron mobility transistor overlying the channel layer; and
  a drain electrode of the high electron mobility transistor overlying the channel layer,
  wherein:
    the high electron mobility transistor has a two dimension electron gas along an interface between the channel and first carrier supply layers, the two dimension electron gas has a first density adjacent to a first point, a second density adjacent to a second point, and a third density adjacent to a third point, and the second point is disposed between the first point and the third point, the gate electrode is closer to the first point than to the second and third points, the drain electrode is closer to the third point than to the first and second points, the second point is disposed between the first and third points, each of the first density, second density, and third density is greater than a density of the two dimension electron gas under the gate electrode, and the second density is greater than each of the first and third densities.

2. The electronic device of claim 1, wherein the drain electrode overlies the third point.

3. The electronic device of claim 1, wherein the gate electrode does not overlie the first point.

4. The electronic device of claim 3, wherein a fourth point underlies the gate electrode, and the two dimension electron gas does not include the fourth point, or the two dimension electron gas is lower than each of the first, second, and third densities.

5. The electronic device of claim 1, further comprising a second carrier supply layer that is thicker over the second point, as compared to the first point.

6. The electronic device of claim 1, further comprising a dielectric layer over the gate electrode, wherein the dielectric layer includes a first portion having a length that extends in a direction toward the drain electrode.

7. An electronic device comprising:
a channel layer;
a first carrier supply layer overlying the channel layer;
a gate electrode of a high electron mobility transistor overlying the channel layer;
a drain electrode of the high electron mobility transistor overlying the channel layer; and
a second carrier supply layer including:
a first film overlying the first carrier supply layer; and
a second film overlying the first film, wherein the gate electrode is closer to the first film than the second film, and the second film is closer to the drain electrode than the gate electrode.

8. The electronic device of claim 7, wherein the drain electrode overlies the first film and not the second film of the second carrier supply layer.

9. The electronic device of claim 7, wherein the second carrier supply layer is substantially monocrystalline.

10. The electronic device of claim 7, wherein the second carrier supply layer is an AlN layer.

11. The electronic device of claim 7, further comprising a dielectric layer over the gate electrode, wherein the dielectric layer includes a first portion having a first length that extends in a first direction toward the drain electrode.

12. The electronic device of claim 11, wherein the dielectric layer includes a second portion that lies along a sidewall of the gate electrode, is contiguous with the first portion, and is farther from the drain electrode as compared to the first portion.

13. The electronic device of claim 11, further comprising a source electrode of the high electron mobility transistor, wherein the dielectric layer:
includes a second portion having a second length that extends in a second direction toward the source electrode and opposite the first direction, wherein the second length is shorter than the first length; or
does not include a portion having a length extending from the gate electrode toward the source electrode along the second direction.

14. The electronic device of claim 7, further comprising an etch-stop layer overlying the first carrier supply layer, wherein the gate electrode overlies the etch-stop layer.

15. The electronic device of claim 14, further comprising a third carrier supply layer disposed between the first and second charge supply layers.

16. The electronic device of claim 7, further comprising an etch-stop layer, wherein the etch-stop layer is disposed between the first and second charge supply layers.

17. The electronic device of claim 7, further comprising:
a source electrode of the high electron mobility transistor overlying the channel layer; and
a dielectric layer over the gate electrode,
wherein:
the second carrier supply layer is a substantially monocrystalline AlN layer,
the drain electrode does not overlie the second film of the second carrier supply layer,
the dielectric layer includes an oxide and:
has a first portion having a first length that extends in a first direction toward the drain electrode, and
has a second portion having a second length that extends in a second direction toward the source electrode, wherein the second direction is opposite the first direction, and the second length is shorter than the first length.

18. A process of forming an electronic device comprising:
forming a first carrier supply layer over a channel layer;
forming a gate electrode of a high electron mobility transistor over the channel layer;
forming a second carrier supply layer over the first carrier supply layer; and
forming a drain electrode of the high electron mobility transistor overlying the channel layer,
wherein:
first, second, and third points lie along an interface between the channel and first carrier supply layer, and the second point is disposed between the first point and the third point,
each of the gate electrode and the drain electrode does not overlie any of the first point, the second point, and the third point,
the gate electrode is closer to the first point than to the second and third points,
the drain electrode is closer to the third point than to the first and second points,
the second point is disposed between the first and third points,
the second carrier supply layer has a has a first thickness above the first point, a second thickness above the second point, and a third thickness above the third point, and
the second thickness is thicker than the first and third thicknesses.

19. The process of claim 18, wherein forming the second charge supply layer comprises forming at least a portion of the second carrier supply layer using plasma enhanced atomic layer deposition.

20. The process of claim 19, further comprising forming a dielectric layer over the gate electrode, wherein the dielectric layer includes a portion, wherein the portion extends towards the drain electrode.

* * * * *

UNITED STATES PATENT AND TRADEMARK OFFICE
CERTIFICATE OF CORRECTION

PATENT NO. : 10,680,092 B2
APPLICATION NO. : 16/148127
DATED : June 9, 2020
INVENTOR(S) : Peter Moens et al.

Page 1 of 1

It is certified that error appears in the above-identified patent and that said Letters Patent is hereby corrected as shown below:

In the Claims

Column 18, Line 53, please replace "has a has a" with --has a--.

Signed and Sealed this
Sixth Day of October, 2020

Andrei Iancu
*Director of the United States Patent and Trademark Office*